(12) United States Patent
Matsushita (10) Patent No.: US 11,114,526 B2
(45) Date of Patent: Sep. 7, 2021

(54) SEMICONDUCTOR DEVICE (71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kenichi Matsushita, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/289,304

(22) Filed: Feb. 28, 2019

(65) Prior Publication Data

US 2020/0091283 A1    Mar. 19, 2020

(30) Foreign Application Priority Data

Sep. 15, 2018   (JP) .............................. JP2018-173140

(51) Int. Cl.
*H01L 29/06*   (2006.01)
*H01L 29/40*   (2006.01)
(Continued)

(52) U.S. Cl.
CPC ........ *H01L 29/0623* (2013.01); *H01L 29/402* (2013.01); *H01L 29/7304* (2013.01); *H01L 29/7397* (2013.01); *H01L 29/868* (2013.01)

(58) Field of Classification Search
CPC ............... H01L 29/0623; H01L 29/868; H01L 29/7304; H01L 29/7397; H01L 29/402;
(Continued)

(56) References Cited

U.S. PATENT DOCUMENTS 4,672,738 A     6/1987  Stengl et al.
5,969,400 A  * 10/1999  Shinohe .............. H01L 27/0761
                                                        257/170
(Continued)

FOREIGN PATENT DOCUMENTS

EP        0176778 A2   4/1986
JP        S61-84830 A  4/1986
(Continued)

OTHER PUBLICATIONS

R. Stengl and U. Gosele "Variation of Lateral Doping—A New Concept to Avoid High Voltage Breakdown of Planar Junctions", IEDM, 1985, pp. 154-157, IEEE.

*Primary Examiner* — Natalia A Gondarenko
(74) *Attorney, Agent, or Firm* — Kim & Stewart LLP (57) ABSTRACT

A semiconductor device includes a semiconductor substrate of a first conductivity type. The semiconductor substrate includes a first semiconductor region of a second conductivity type at a surface thereof, a second semiconductor region of the second conductivity type at the surface and surrounding the first semiconductor region, a third semiconductor region of the second conductivity type provided in the second semiconductor region at the surface and surrounding the first semiconductor region. The third semiconductor region has a concentration of a second conductivity type impurity higher than that of the second semiconductor region. A first insulating film is provided on a part of the first surface at which the second semiconductor region is provided. the first insulating film having an opening that exposes. A first electrode is provided on the first insulating film and electrically connected to the third semiconductor region via the opening.

8 Claims, 10 Drawing Sheets

(51) Int. Cl.
*H01L 29/73* (2006.01)
*H01L 29/739* (2006.01)
*H01L 29/868* (2006.01)

(58) Field of Classification Search
CPC .......... H01L 29/66348; H01L 29/0619; H01L 29/404; H01L 29/7811; H01L 29/41741; H01L 29/7395; H01L 29/408; H01L 29/42368; H01L 29/872; H01L 29/0634; H01L 29/0692; H01L 29/0886; H01L 29/66719; H01L 29/7393; H01L 29/78; H01L 29/7827; H01L 29/8083; H01L 29/861; H01L 27/088; H01L 29/0696; H01L 29/08; H01L 29/0821; H01L 29/083; H01L 29/0804; H01L 29/1095; H01L 29/407; H01L 29/42304; H01L 29/42352; H01L 29/42356; H01L 29/4236; H01L 29/42364; H01L 29/66234; H01L 29/7398; H01L 29/7396; H01L 29/66295; H01L 29/66303; H01L 29/66333

USPC ........ 257/139, 144, 493, E29.014, 378, 487, 257/488, 655

See application file for complete search history.

(56) References Cited

U.S. PATENT DOCUMENTS

| | | | |
|---|---|---|---|
| 8,749,017 | B2 | 6/2014 | Lu |
| 9,349,811 | B2* | 5/2016 | Takahashi ........... H01L 29/0619 |
| 2011/0233714 | A1 | 9/2011 | Lu |
| 2013/0153954 | A1* | 6/2013 | Takahashi ........... H01L 29/7395 257/139 |
| 2015/0021670 | A1* | 1/2015 | Schulze .............. H01L 29/7811 257/288 |
| 2015/0021747 | A1 | 1/2015 | Nishii et al. |
| 2015/0255535 | A1 | 9/2015 | Taguchi et al. |
| 2016/0268193 | A1* | 9/2016 | Nishikawa ........ H01L 21/76877 |

FOREIGN PATENT DOCUMENTS

| | | | |
|---|---|---|---|
| JP | H11-330456 A | 11/1999 |
| JP | 5515922 B2 | 6/2014 |

\* cited by examiner

SEMICONDUCTOR DEVICE

CROSS-REFERENCE TO RELATED APPLICATION

This application is based upon and claims the benefit of priority from. Japanese Patent Application No. 2018-173140, filed on Sep. 15, 2018, the entire contents of which are incorporated herein by reference.

FIELD

Embodiments described herein relate generally to a semiconductor device.

BACKGROUND

Various power semiconductor devices are being developed in a wide range of fields including power generation, power transmission, rotary machines such as pumps and blowers, power supplies such as communication systems and factories, railroads by alternating-current motors, electric vehicles, and household electrical appliances. Such power semiconductor devices may include semiconductor elements, such as an IGBT (Insulated Gate Bipolar Transistor) and a PIN diode.

As a termination structure of recent power semiconductor devices, a structure called VLD (Variation of Lateral Doping) structure may be used. The VLD structure has an advantage of being able to reduce the size of the termination structure as compared with a guard ring structure and the like which is used in related art. However, since the impurity concentration in the VLD structure is low, there is a problem in that the depletion layer reaches an electrode during an OFF state, and the leakage current increases. Further, if a semiconductor layer with a higher concentration is formed separately to prevent this issue, the number of manufacturing processes may increase.

DETAILED DESCRIPTION

Embodiments provide a semiconductor device with high breakdown voltage.

In general, according to an embodiment, a semiconductor device includes a semiconductor substrate of a first conductivity type. The semiconductor substrate includes a first semiconductor region of a second conductivity type at a surface thereof, a second semiconductor region of the second conductivity type at the surface and surrounding the first semiconductor region, a third semiconductor region of the second conductivity type provided in the second semiconductor region at the surface and surrounding the first semiconductor region. The third semiconductor region has a concentration of a second conductivity type impurity higher than that of the second semiconductor region. A first insulating film is provided on a part of the first surface at which the second semiconductor region is provided. the first insulating film having an opening that exposes. A first electrode is provided on the first insulating film and electrically connected to the third semiconductor region via the opening.

Embodiments will be described below using the accompanying drawings. It is noted that in the drawings, the same or similar reference numerals are assigned to the same or similar parts.

In the specification, the same reference numerals may be assigned to the same or similar members to omit redundant description.

In order to represent the positional relationship between parts and the like herein, the upward direction in the drawing is described as "upper", and the downward direction in the drawing as "lower". The concept of "upper" and "lower" herein is not necessarily a term representing the relationship with the direction of the gravity.

In the specification, the notations n+, n, n− and p+, p, p− represent relative high and low of impurity concentrations in each conductivity type. That is, n+ indicates that the n type impurity concentration is relatively higher than n, and n− indicates that the n type impurity concentration is relatively lower than n. Further, p+ indicates that the p type impurity concentration is relatively higher than p, and p− indicates that the p type impurity concentration is relatively lower than p. It is noted that n+ and n− may be simply described as n type, and p+ and p− may be simply described as p type.

Hereinafter, a case where a first conductivity type is of n type and a second conductivity type is of p type will be described as an example.

First Embodiment

A semiconductor device according to the present embodiment includes: a first conductivity type semiconductor substrate having a first surface and a second surface; a first semiconductor region of a second conductivity type provided on the first surface; a second semiconductor region of a second conductivity type surrounding the first semiconductor region around the first semiconductor region on the first surface; a third semiconductor region of a second conductivity type surrounding the first semiconductor region in the second semiconductor region on the first surface, and having a second conductivity type impurity concentration higher than that of the second semiconductor region; a first insulating film surrounding the first semiconductor region on the second semiconductor region, and having a hole in the top of the third semiconductor region; and a first electrode provided on the first insulating film and electrically connected to the third semiconductor region via the hole.

Further, the semiconductor device according to the embodiment includes: a first conductivity type semiconductor substrate having a first surface and a second surface; a first semiconductor region of a second conductivity type provided on the first surface; a second semiconductor region of a second conductivity type surrounding the first semiconductor region around the first semiconductor region on the first surface; a first insulating film surrounding the first semiconductor region on the second semiconductor region, and having a hole; a first electrode provided on the first insulating film and electrically connected to the second semiconductor region via the hole; and a second electrode electrically connected to the first semiconductor region, and spaced apart from the first electrode.

Figure 1:
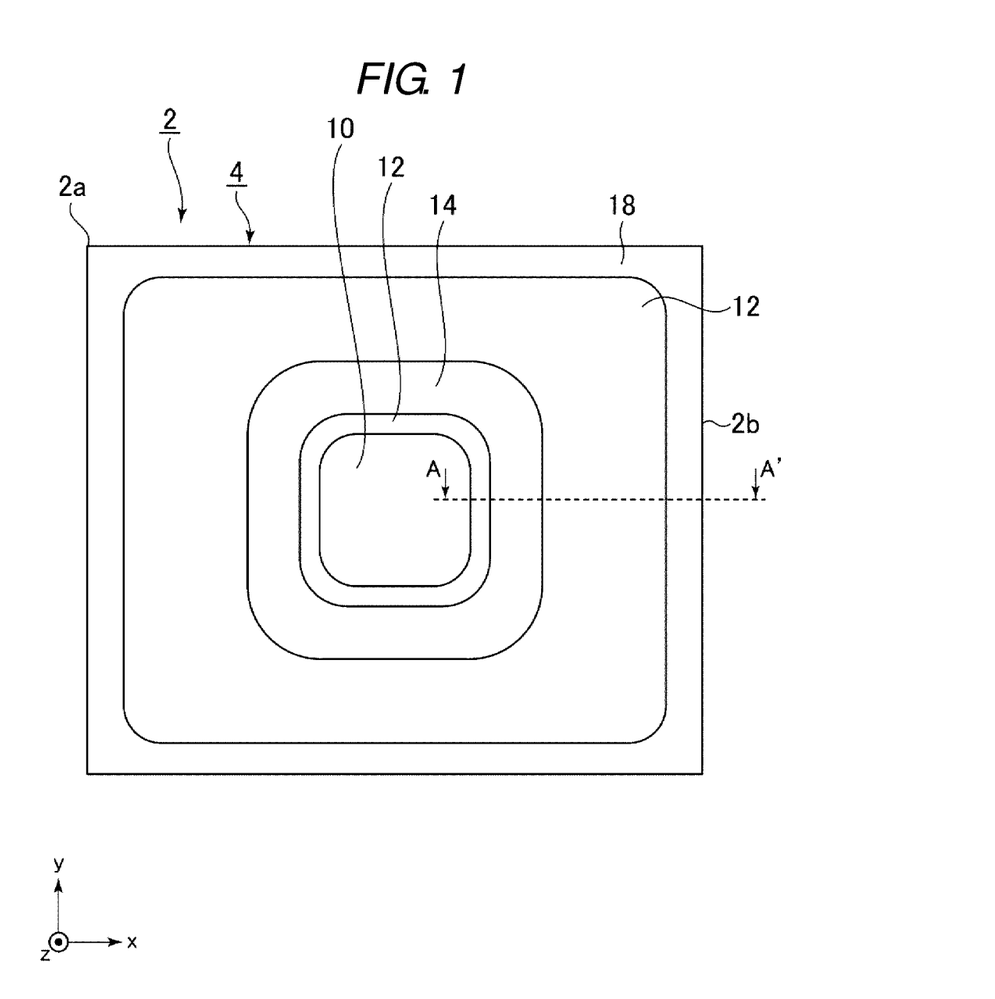
FIG. 1 illustrates a schematic top view of a semiconductor device according to a first embodiment.

FIG. 1 illustrates a schematic top view of a semiconductor device 100 according to the embodiment. The semiconductor device 100 is a PIN diode.

The semiconductor device 100 includes a semiconductor substrate 2, an anode electrode 10 (an example of a second electrode), a first insulating film 12, a first hole 13a (an example of a hole), a field plate electrode 14 (an example of a first electrode), a stopper electrode 18, a stopper layer 20, a cathode layer 24 (an example of a seventh semiconductor region), a cathode electrode 26 (an example of a third electrode), a p+ type semiconductor region 28 (an example of a third semiconductor region), an n type surface semiconductor region 30 (an example of a fourth semiconductor region), an anode layer 32 (an example of a first semiconductor region), and a p type semiconductor region 40 (an example of a second semiconductor region).

The semiconductor substrate 2 has a first surface 4 and a second surface 6. The portion between the first surface 4 and the second surface 6 functions as a drift layer 22 of the PIN diode.

The p type semiconductor region 40 includes a ballast resistance region 42 (an example of a fifth semiconductor region) and a VLD region 44 (an example of a sixth semiconductor region). The ballast resistance region 42 includes a first ballast resistance region portion 42a and a second ballast resistance region portion 42b.

Figure 2:
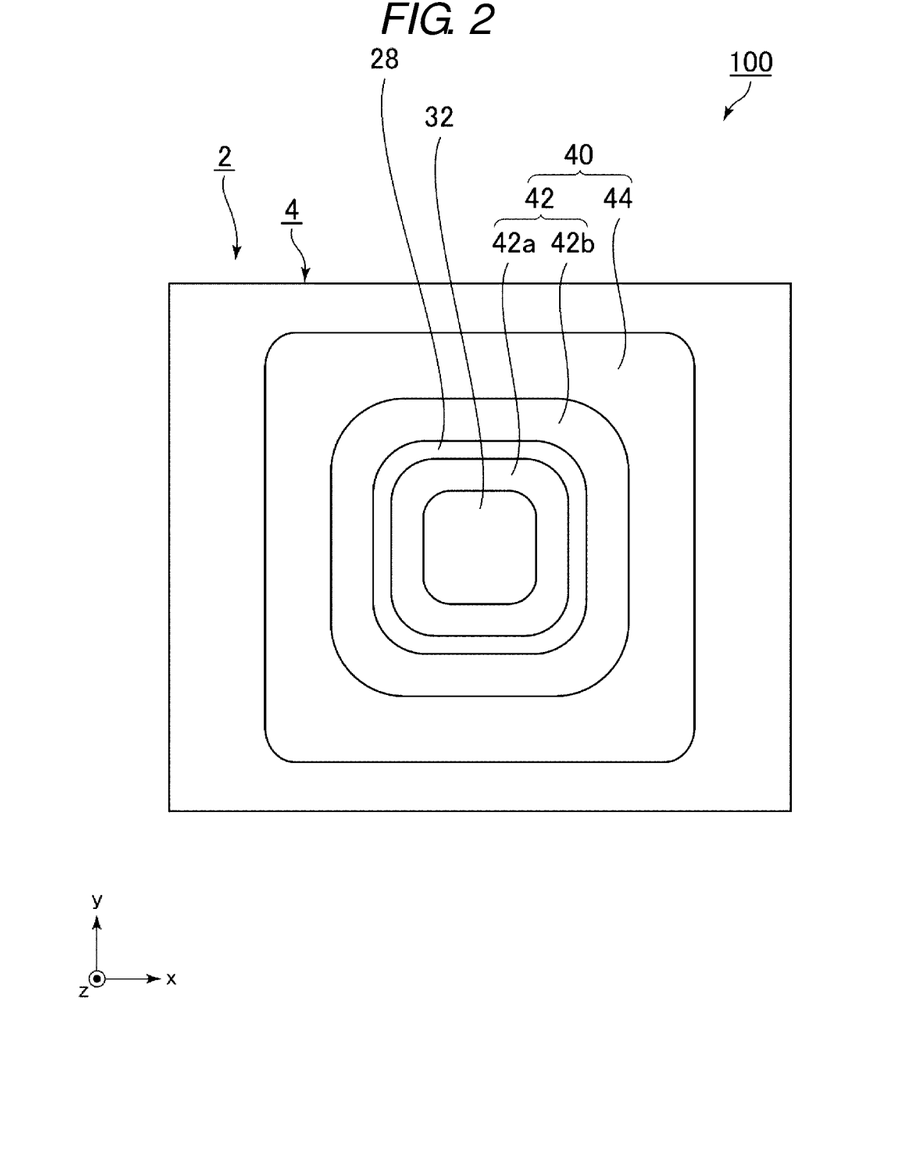
FIG. 2 illustrates another schematic top view of the semiconductor device according to the first embodiment.

FIG. 2 illustrates another schematic top view of the semiconductor device 100. In FIG. 2, the anode electrode 10, the first insulating film 12, the field plate electrode 14, the stopper electrode 18, and the n type surface semiconductor region 30 in FIG. 1 are not shown, and the p+ type semiconductor region 28, the anode layer 32, the p type semiconductor region 40, the ballast resistance region 42, and the VLD region 44 are shown.

Figure 3A:
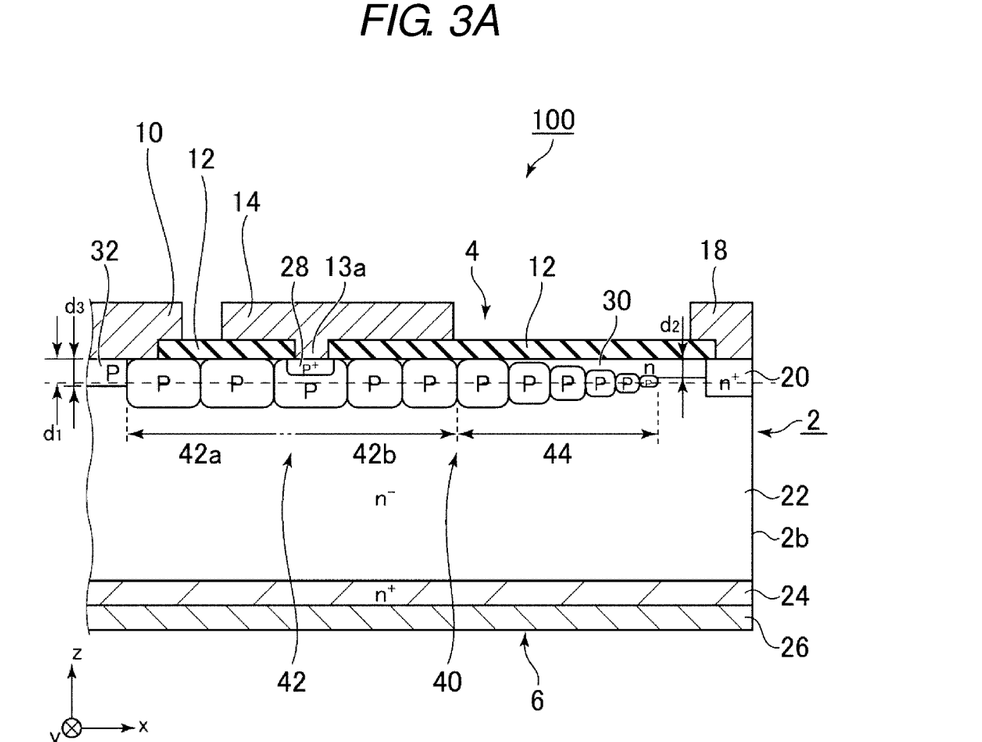
FIGS. 3A and 3B illustrate schematic cross-sectional views of a main part of the semiconductor device according to the first embodiment.
Figure 3B:
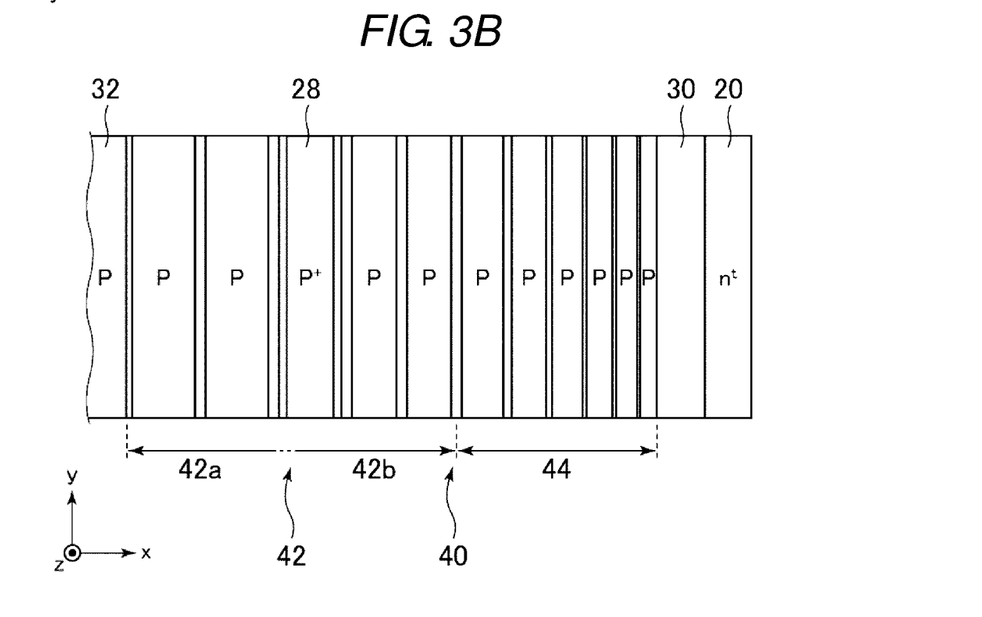

FIGS. 3A and 3B illustrate schematic diagrams of a main part of the semiconductor device 100. FIG. 3A illustrates a schematic cross-sectional view of the semiconductor device 100 taken along the line A-A' shown in FIG. 1. FIG. 3B illustrates a top view of the semiconductor device 100 showing the portion including the A-A' cross section shown in FIG. 1, with the anode electrode 10, the first insulating film 12, the field plate electrode 14, and the stopper electrode 18 omitted. It is noted that, as shown in FIG. 3, each of the ballast resistance region 42 and the VLD region 44 may have a plurality of regions each containing a p type impurity.

Hereinafter, the semiconductor device 100 will be described with reference to FIGS. 1, 2, 3A, and 3B.

The n− type semiconductor substrate 2 is, for example, a Si (silicon) substrate. Then type impurity is, for example, P (phosphorus). Here, x axis, y axis perpendicular to x axis, and z axis perpendicular to x axis and y axis are defined. It is assumed that the first surface 4 and the second surface 6 are arranged in parallel to an xy plane. Further, in the following, it is assumed that the first surface 4 is displayed on the upper side, and the second surface 6 is displayed on the lower side.

The p type anode layer 32 is provided at the central portion of the first surface 4. The p type impurity is, for example, B (boron).

The p type semiconductor region 40 surrounds the anode layer 32 around the anode layer 32 on the first surface 4. The ballast resistance region 42 surrounds the anode layer 32 around the anode layer 32. The VLD region 44 surrounds the ballast resistance region 42 around the ballast resistance region 42. In other words, the ballast resistance region 42 and the VLD region 44 are formed in a ring shape on the first surface 4, respectively. In the VLD region 44, the gradient of the p type impurity in the plane parallel to the first surface 4 decreases as closer to the end portion 2b of the semiconductor substrate with a larger gradient than that of the ballast resistance region 42. This point will be described below with reference to FIG. 4.

The p+ type semiconductor region 28 surrounds the anode layer 32 in the p type semiconductor region 40 on the first surface 4. The p type impurity concentration of the p+ type semiconductor region 28 is higher than the impurity concentration of the p type semiconductor region 40.

In the schematic view of FIG. 3A, the p+ type semiconductor region 28 is formed at a certain position of the ballast resistance region 42. The ballast resistance region 42 inside the p+ type semiconductor region 28 is the first ballast resistance region portion 42a. Further, the ballast resistance region 42 outside the p+ type semiconductor region 28 is the second ballast resistance region portion 42b. The thickness of the p+ type semiconductor region 28 is smaller than the thickness of the p type semiconductor region 40.

The p type impurity concentration of the p type semiconductor region 40 has a maximum value at a predetermined distance $d_1$ from the first surface 4.

The first insulating film 12 surrounds the anode layer 32 on the p type semiconductor region 40. In the first insulating film 12, a first hole 13a (an example of a hole) is formed in a ring shape along the top of the p+ type semiconductor region 28. The first insulating film 12 is, for example, a silicon oxide film.

The field plate electrode 14 is formed on the first insulating film 12. The field plate electrode 14 is electrically connected to the p+ type semiconductor region 28 through the first hole 13a. The field plate electrode 14 is made of, for example, aluminum (Al). The front end of the field plate electrode 14 on the side of the end portion 2b is formed between the ballast resistance region 42 and the VLD region 44. However, the position where the front end of the field plate electrode 14 is formed is not limited thereto.

The anode electrode 10 is electrically connected to the anode layer 32 on the anode layer 32, and a part thereof is formed on the first insulating film 12. The anode electrode 10 is made of aluminum (Al). The anode electrode 10 is spaced apart from the field plate electrode 14.

The n+ type stopper layer 20 is formed on the outer surface of the semiconductor device 100 on the first surface 4. The stopper electrode 18 is formed on the stopper layer 20. The stopper electrode 18 is electrically connected to the stopper layer 20. The stopper layer 20 is directed to preventing the depletion layer from reaching an uneven surface, not shown, formed by dicing at the end portion 2b. The stopper electrode 18 is directed to causing the potential of the stopper layer 20 to be more uniform within the semiconductor device 100.

The n type surface semiconductor region 30 surrounds the anode layer 32 on the first surface 4. The impurity concentration of the n type surface semiconductor region 30 is higher than the n type impurity concentration of the semiconductor substrate 2. As described above, the p type impurity concentration of the p type semiconductor region 40 has the maximum value at the predetermined distance $d_1$ in the substrate depth direction from the first surface 4, but the predetermined distance $d_1$ is longer than the thickness $d_2$ of the n type surface semiconductor region 30.

The n type cathode layer 24 is formed on the second surface 6. The n type impurity concentration of the cathode layer 24 is higher than the n type impurity concentration of the semiconductor substrate 2.

The cathode electrode 26 is electrically connected to the cathode layer 24. The cathode electrode 26 is made of, for example, aluminum (Al).

Figure 4:
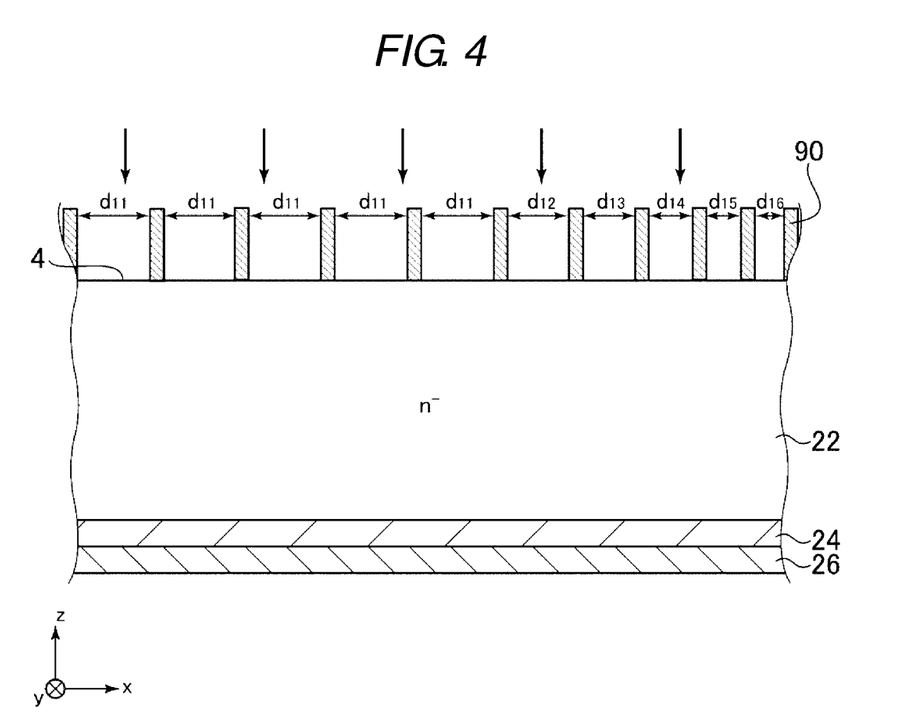
FIG. 4 illustrates a schematic cross-sectional view showing a part of a manufacturing process of the semiconductor device according to the first embodiment.

FIG. 4 illustrates a schematic cross-sectional view of the semiconductor device 100 to showing a part of a manufacturing process of the semiconductor device 100. FIG. 4 shows a manufacturing process of the p type semiconductor region 40 in the manufacturing process of the semiconductor device 100.

In FIG. 4, a plurality of mask materials 90 are formed on the first surface 4. Here, the mask materials 90 have the same width in x direction. On the other hand, the intervals between the respective mask materials 90 are equally $d_{11}$ on the inner side of the semiconductor substrate 2. On the other hand, the intervals on the outer side are $d_{12}$, $d_{13}$, $d_{14}$, $d_{15}$ and $d_{16}$, respectively. It is noted that $d_{11} > d_{12} > d_{13} > d_{14} > d_{15} > d_{16}$. Here, a p type impurity is implanted, and thereafter, the mask materials 90 are removed by asking or the like to perform heat treatment. The intervals between the respective mask materials 90 are made small so that the distributions of the p type impurity implanted between the respective mask materials 90 overlap each other. The ballast resistance region 42 are formed in the portions where the intervals between the respective mask materials 90 are at dn. On the other hand, the VLD regions 44 are formed in the portions where the intervals of the respective mask materials 90 are $d_{12}$, $d_{13}$, $d_{14}$, $d_{15}$ and $d_{16}$.

Since the intervals between the mask materials 90 are equally $d_{11}$, there is no gradient of the p type impurity concentration in a plane parallel to the first surface 4 in the ballast resistance region 42, and the concentration is constant. On the other hand, since the intervals between the mask materials 90 narrow like $d_{12} > d_{13} > d_{14} > d_{15} > d_{16}$ as closer to the end portion 2b, the gradient of the p type impurity concentration in the plane parallel to the first surface 4 in the VLD region 44 is larger than that of the ballast resistance region 42, and decreases as closer to the end portion 2b of the semiconductor substrate 2. It is noted that, depending on the degree of heat treatment and how the mask materials 90 are formed, the distribution of the p type impurity concentration in the ballast resistance region 42 and the VLD region 44 is such that places where the concentration of p type impurity is low may be formed as shown in FIG. 3. Alternatively, places where the concentration of p type impurity is low may not be formed, and more uniform distribution may be formed due to heat treatment. In any case, from a macroscopic viewpoint, in the VLD region 44, the gradient of the p type impurity in the plane parallel to the first surface 4 decreases as closer to the end portion 2b of the semiconductor substrate with a larger gradient than that of the ballast resistance region 42.

For example, a p type semiconductor region 40 is formed by implanting a p type impurity using a commercially available high acceleration ion implantation device, and an n type surface semiconductor region 30 is formed by implanting an n type impurity using a normal ion implantation device. As a result, the predetermined distance $d_1$ can be made longer than the thickness $d_2$ of the n type surface semiconductor region 30.

It is noted that the method of manufacturing the p type semiconductor region 40 and the n type surface semiconductor region 30 is not limited to the above.

Next, the operational effects of the embodiment will be described.

Figure 5A:
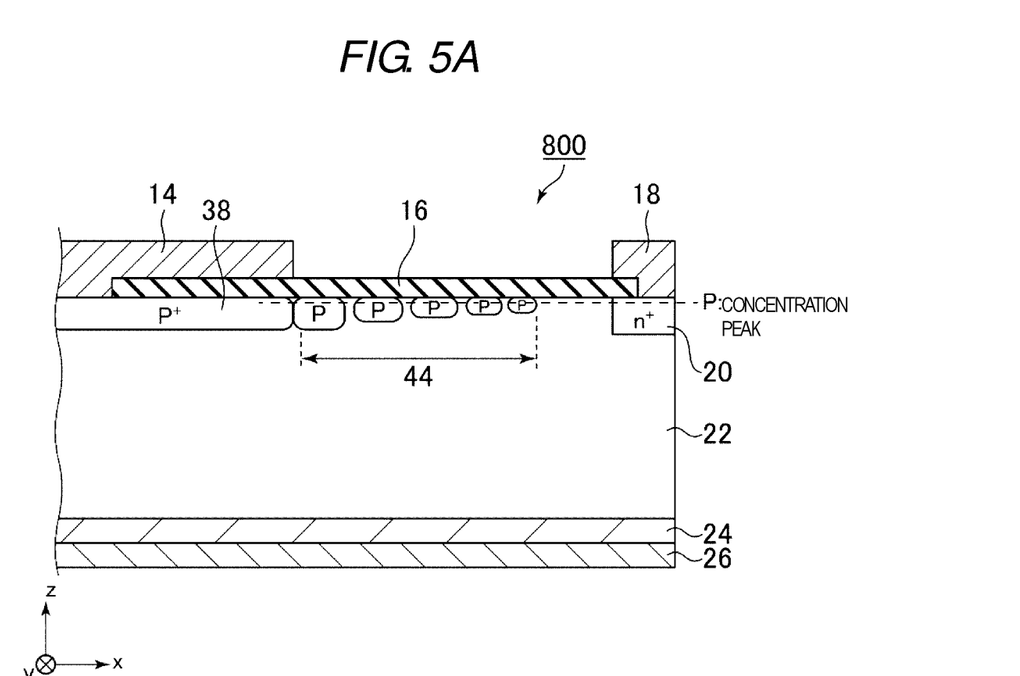
FIGS. 5A and 5B illustrate schematic cross-sectional views of a main part of a semiconductor device according to a comparative example.
Figure 5B:
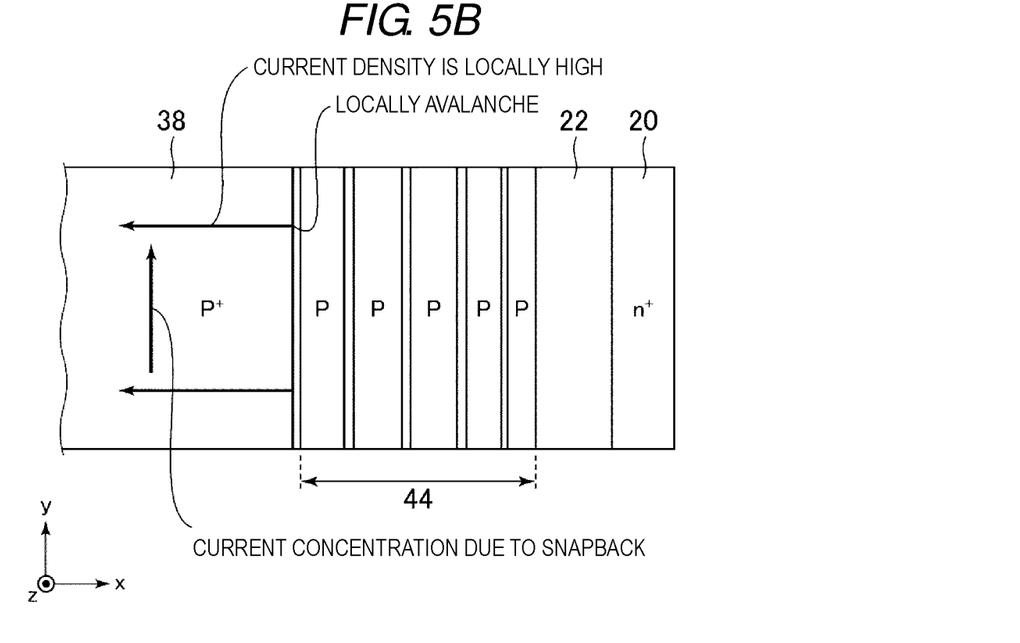

FIGS. 5A and 5B are schematic diagrams of a main part of a semiconductor device 800 according to a comparative example. In the semiconductor device 800, the VLD region 44 is provided. Further, instead of the ballast resistance region 42, a p+ type region 38 having a higher p type impurity concentration is provided. On the other hand, the p+ type semiconductor region 28 is not provided. Further, the field plate electrode 14 is formed integrally with the anode electrode 10, not shown, and is not floating.

The p+ type region 38 under the field plate electrode 14 is less likely to be depleted. Therefore, when a reverse voltage is applied to the semiconductor device 800, avalanche breakdown may occur locally below the end portion of the field plate electrode 14. Holes generated by the avalanche breakdown pass through the p+ type region 38 and locally flow toward the anode electrode 10, not shown. At that time, since the resistance of the p+ type region 38 is extremely low, the current density is locally high, so there is a problem that the semiconductor device 800 is locally damaged. Further, a phenomenon called snapback, in which locally flowing holes flow more concentratedly, may occur, so that holes flow further concentratedly locally. Therefore, the local damage of the semiconductor device 800 is further increased.

Figure 6A:
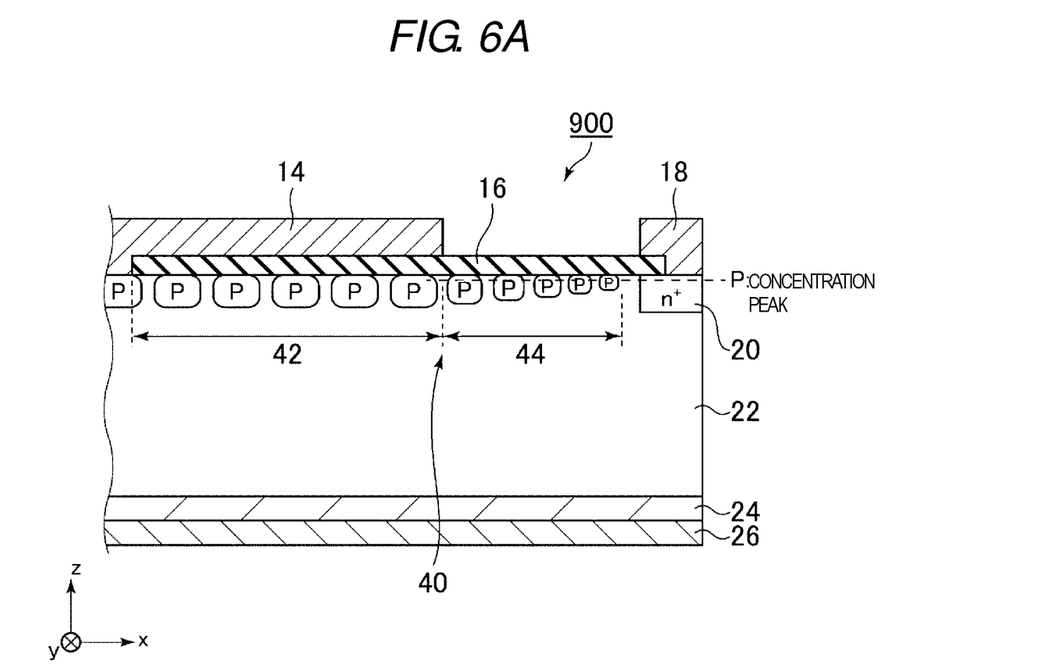
FIGS. 6A and 6B illustrate schematic cross-sectional views of a main part of a semiconductor device according to another comparative example.
Figure 6B:
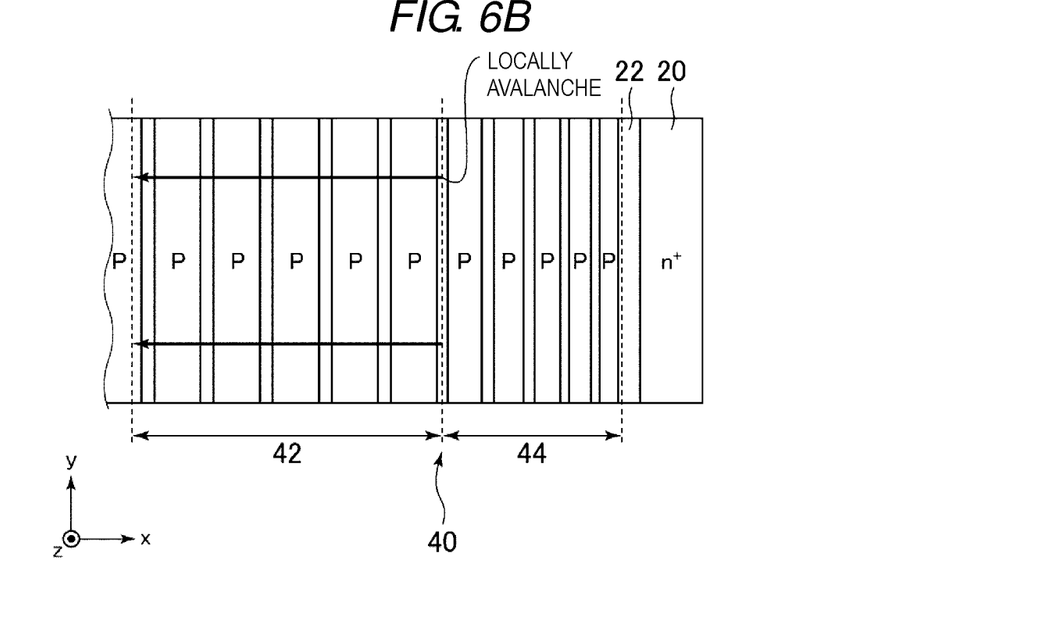

FIGS. 6A and 6B are schematic diagrams of a main part of a semiconductor device 900 according to another comparative example. In the semiconductor device 900, the ballast resistance region 42 is provided. On the other hand, the p+ type semiconductor region 28 is not provided. Further, the field plate electrode 14 is formed integrally with the anode electrode 10, not shown, and is not floating.

Since the p type impurity concentration of the ballast resistance region 42 is lower than the p type impurity concentration of the p+ type region 38 and the resistance thereof is high, current concentration due to snapback may not occur as in the semiconductor device 800. However, because of local avalanche breakdown, a state in which the current density is locally high may occur. Therefore, also in this case, there is a problem that the semiconductor device 900 is locally damaged.

Figure 7A:
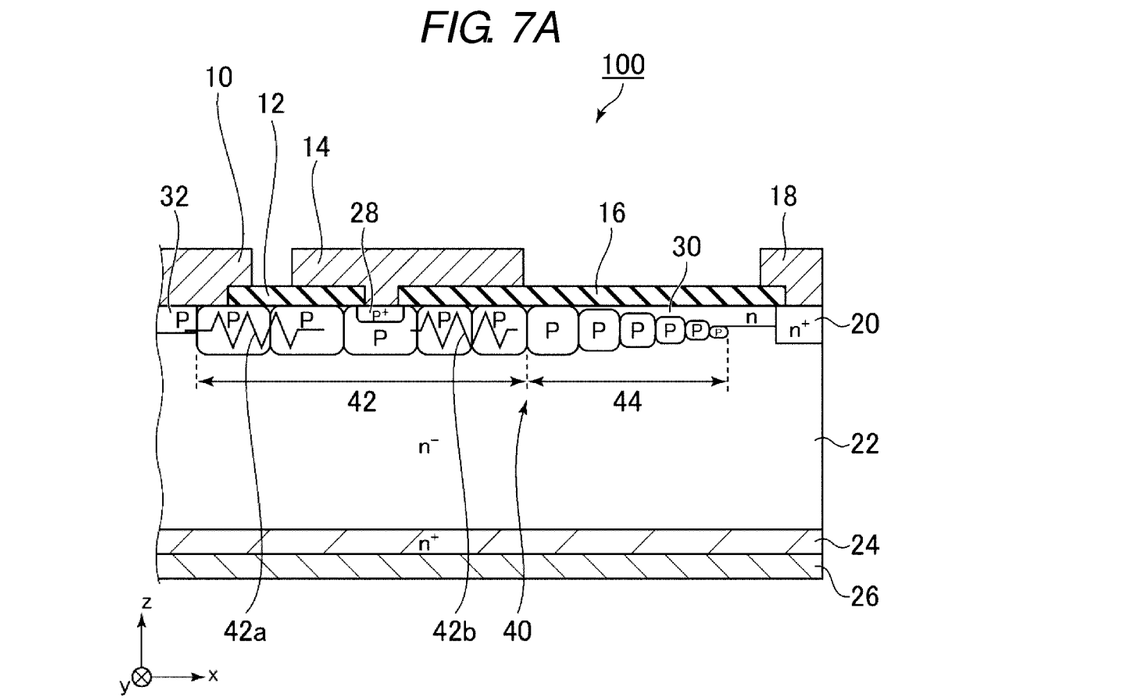
FIGS. 7A and 7B illustrate operational effects of the semiconductor device according to the first embodiment.
Figure 7B:
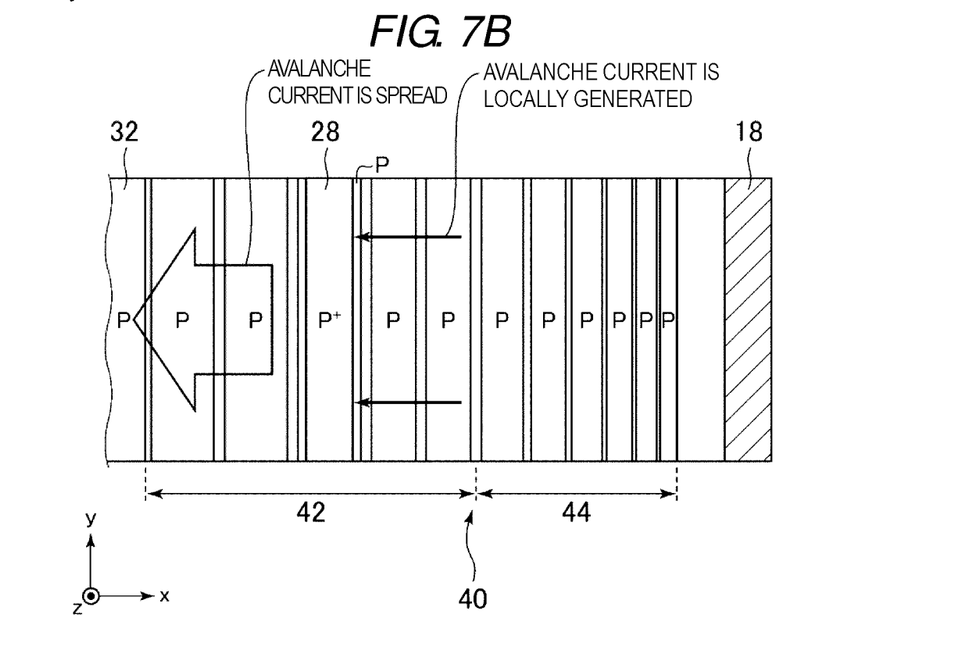

FIGS. 7A and 7B are diagrams illustrating operational effects of the semiconductor device 100 according to the embodiment.

The holes generated by the local avalanche breakdown flow to the left side of the page. The p type impurity concentration of the second ballast resistance region portion 42b is lower than the p type impurity concentration of the p+ type region 38. Therefore, due to the high resistance component, current concentration due to snapback hardly occurs. On the other hand, holes entering the p+ type semiconductor region 28 spread further in y direction through the field plate electrode 14.

As a result, the avalanche current flows more uniformly in the first ballast resistance region portion 42a. Therefore, since the local current concentration does not occur, the breakdown voltage of the semiconductor device 100 can be increased.

It is noted that, depending on the design, the ballast resistance region may function as a VLD region, or the VLD region may function as a ballast resistance region. Therefore, the operation of the semiconductor device 100 is not limited to the above.

The resin or the like of the package in which the semiconductor device 100 is incorporated contains ions. If the ions mixes into the semiconductor device 100 during the operation of the semiconductor device 100, there is a problem that the breakdown voltage fluctuates. For example, when ions having a negative charge are mixed into, positive charges are generated at the interface between the first insulating film 12 and the semiconductor substrate 2. As a result, the n type impurity concentration at the interface between the first insulating film 12 and the semiconductor substrate 2 may become low. To deal with this issue, the n type surface semiconductor region 30 is provided for compensation.

By setting the predetermined distance $d_1$ in the substrate depth direction from the first surface 4 where the p type impurity concentration of the p type semiconductor region 40 has a maximum value to be longer than the thickness $d_2$ of the n type surface semiconductor region 30, it is possible to prevent the effect of the n type impurity in the n type surface semiconductor region 30 from being canceled out by the p type impurity.

According to the semiconductor device of the first embodiment, it is possible to provide a semiconductor device with high breakdown voltage.

Second Embodiment

A semiconductor device according to a second embodiment is different from that of the first embodiment in that the fifth semiconductor region provided inside the third semiconductor region includes an eighth semiconductor region in a portion close to a corner portion of the semiconductor substrate, and a ninth semiconductor region provided adjacent to the eighth semiconductor region, and having a second conductivity type impurity concentration higher than that of the eighth semiconductor region. Here, the description overlapping with the first embodiment will be omitted.

Figure 8:
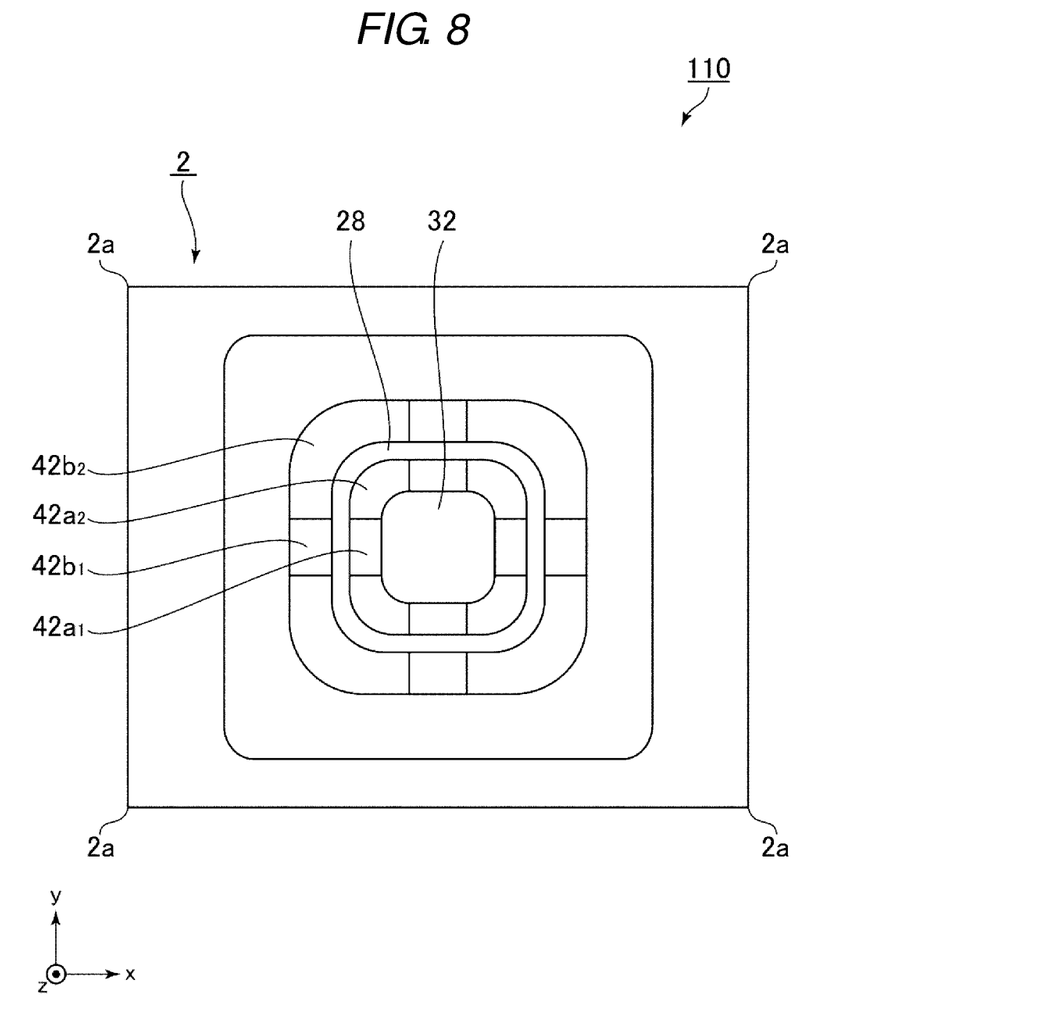
FIG. 8 illustrates a schematic top view of a semiconductor device according to a second embodiment.

FIG. 8 illustrates a top view of a semiconductor device 110 according to the second embodiment. In FIG. 8, the anode electrode 10, the first insulating film 12, the field plate electrode 14, the stopper electrode 18, the stopper layer 20, the n type surface semiconductor region 30, and the VLD region 44 are not shown, and the p+ type semiconductor region 28, the anode layer 32, and the ballast resistance region 42 are shown.

A first ballast resistance region portion 42a has a first ballast resistance region portion 42a2 (an example of the eighth semiconductor region) at a portion close to a corner portion 2a. Further, the first ballast resistance region portion 42a has a first ballast resistance region portion 42ai (an example of the ninth semiconductor region) provided adjacent to the first ballast resistance region portion 42a2, and having a p type impurity concentration higher than that of the first ballast resistance region portion 42a2.

Generally, the current density tends to be high in a portion close to the corner portion 2a. In particular, as shown in FIG. 8, in the portion close to the corner portion 2a, a second ballast resistance region portion 42b2 has a curvature. Current is more likely to concentrate on the portion having such a curvature. Therefore, the p type impurity concentration of the first ballast resistance region portion 42ai is made higher than that of the first ballast resistance region portion 42a2 so that the current relatively hardly flows in the portion near the corner portion 2a.

It is noted that the second ballast resistance region portion 42b1 and the second ballast resistance region portion 42b$_2$ may have the same p type impurity concentration so that the avalanche current uniformly flows through the p+ type semiconductor region 28. Further, the p type impurity concentration of the second ballast resistance region portion 42b2 may be lower so that the current is less likely to flow in the portion near the corner portion 2a.

According to the semiconductor device of the second embodiment, it is possible to provide a semiconductor device with high breakdown voltage.

Third Embodiment

A semiconductor device according to a third embodiment is different from that of the first and second embodiments in that the first electrode includes a first electrode portion, and a second electrode portion provided adjacent to the first electrode portion, and having a longer distance from the end portion of the semiconductor substrate than the first electrode portion. Here, the description overlapping with the first and second embodiments will be omitted.

Figure 9:
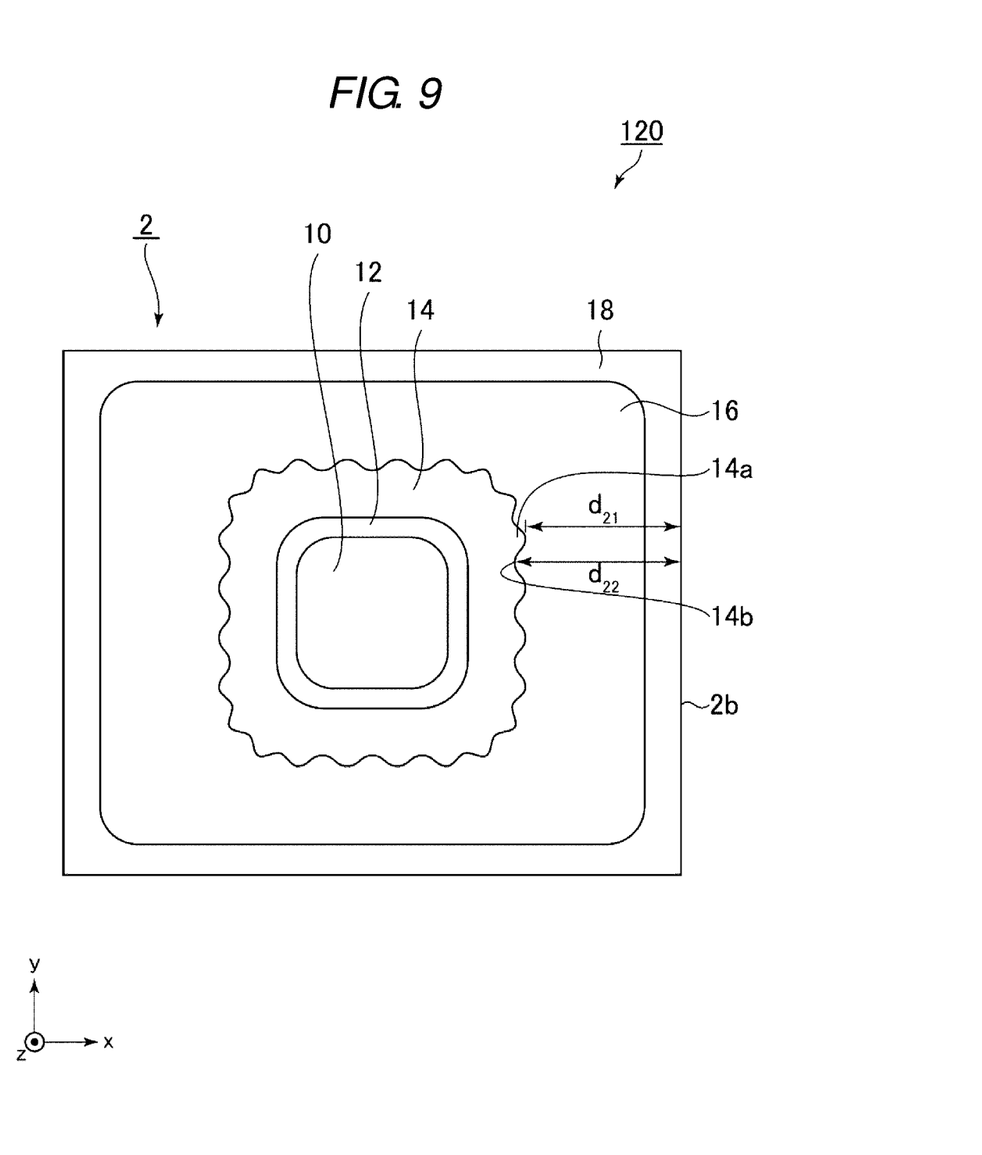
FIG. 9 illustrates a schematic top view of a semiconductor device according to a third embodiment.

FIG. 9 is a schematic top view of a semiconductor device 120 of the embodiment.

The field plate electrode 14 has a first electrode portion 14a and a second electrode portion 14b provided adjacent to the first electrode portion 14a. A distance $d_{22}$ between the second electrode portion 14b and the end portion 2b of the semiconductor substrate 2 is longer than a distance $d_{21}$ between the first electrode portion 14a and the end portion 2b of the semiconductor substrate 2.

More specifically, the outer peripheral portion of the field plate electrode 14 according to the third embodiment has a wave-like shape as a whole, so that there are as many portions as possible where a distance between the end portion 2b of the semiconductor substrate 2 and the outer peripheral portion of the field plate electrode 14 is different. This disperses places where the avalanche breakdown occurs as much as possible to prevent the avalanche current from concentrating.

According to the semiconductor device of the third embodiment, it is possible to provide a semiconductor device with high breakdown voltage.

Fourth Embodiment

A semiconductor device according to a fourth embodiment is different from that of the first to third embodiments in that the semiconductor device further includes a fourth electrode (an example of a gate electrode 62) provided on the first surface, a second insulating film (an example of a gate insulating film 64) provided between the fourth electrode and the first semiconductor region (an example of abase layer 68), a tenth semiconductor region (an example of an emitter layer 66) provided on the first semiconductor region in the first semiconductor region, and having a first conductivity type impurity concentration higher than that of the semiconductor substrate, a fifth electrode (an example of an emitter electrode 70) electrically connected to the tenth semiconductor region, an eleventh semiconductor region (an example of a collector layer 74) of the second conductivity type provided on the second surface of the semiconductor substrate, and a sixth electrode (an example of a collector electrode 76) electrically connected to the eleventh semiconductor region. Here, the description overlapping with the first to third embodiments will be omitted.

Figure 10:
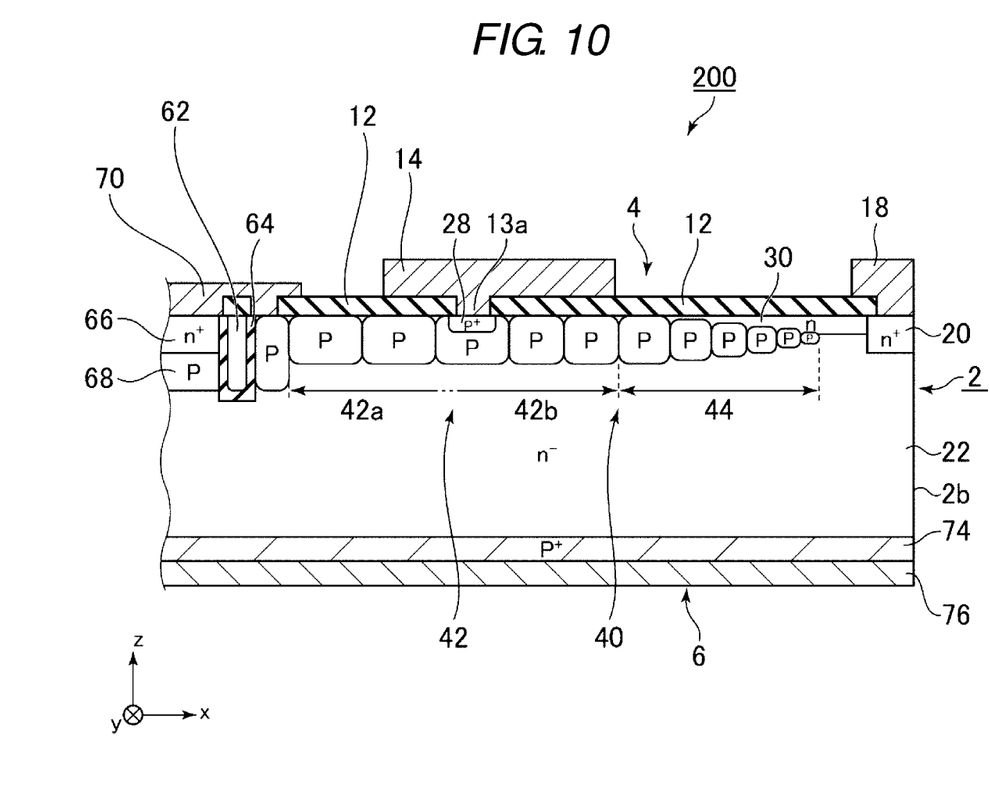
FIG. 10 illustrates a schematic cross-sectional view of a main part of a semiconductor device according to a fourth embodiment.

FIG. 10 is a schematic cross-sectional view of a main part of a semiconductor device 200 according to the fourth embodiment. The semiconductor device 200 is an IGBT.

According to the semiconductor device of the fourth embodiment, it is possible to provide a semiconductor device with high breakdown voltage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor substrate of a first conductivity type having a first surface and a second surface opposite to the first surface;
   an emitter region of the first conductivity type provided in the semiconductor substrate at the first surface;
   a base region of a second conductivity type provided in the semiconductor substrate below and adjacent to the emitter region;
   a gate electrode provided in the semiconductor substrate at the first surface and surrounding the emitter region and the base region;
   a gate insulating film insulating the gate electrode;
   a ballast resistance region of the second conductivity type provided in the semiconductor substrate at the first surface and surrounding the gate electrode;
   a variation of lateral doping (VLD) region of the second conductivity type provided in the semiconductor substrate at the first surface and surrounding the ballast resistance region;
   a semiconductor region of the second conductivity type provided in the ballast resistance region at the first surface, the semiconductor region having a concentration of a second conductivity type impurity higher than that of the ballast resistance region;
   a first insulating film provided on a part of the first surface that surrounds the emitter region and corresponds to the ballast resistance region, the first insulating film having a hole at the top of the semiconductor region;
   a first-conductivity-type surface semiconductor region provided in the semiconductor substrate at the first surface and surrounding the ballast resistance region, the first-conductivity-type surface semiconductor region having a concentration of a first conductivity type impurity higher than that of the semiconductor substrate; and
   a stopper layer of the first conductivity type provided in the semiconductor substrate at the first surface and surrounding the first-conductivity-type surface semiconductor region, a thickness of the stopper layer being greater than a thickness of the first-conductivity-type surface semiconductor region;
   a collector region of the first conductivity type provided in the semiconductor substrate at the second surface;
   a first electrode provided on the first insulating film and electrically connected to the semiconductor region via the hole;
   a second electrode electrically connected to the emitter region, and spaced apart from the first electrode; and
   a third electrode electrically connected to the collector region, wherein
   the VLD region comprises a plurality of sub-regions, the plurality of sub-regions including a first sub-region surrounding the ballast resistance region, a second sub-region adjacent to and surrounding the first sub-region, and a third sub-region adjacent to and surrounding the second sub-region, the third sub-region positioned at an outer edge of the VLD region, and
   a width of the second sub-region in a first direction along the first surface is smaller than a width of the first sub-region in the first direction, and greater than a width of the third sub-region in the first direction.

2. The semiconductor device according to claim 1, wherein:
   the VLD region has a negative concentration gradient of the second conductivity type impurity along the first surface towards a side edge of the semiconductor substrate larger than that of the ballast resistance region.

3. The semiconductor device according to claim 1, wherein an outer edge of the first electrode includes a wave shape portion.

4. The semiconductor device according to claim 1, further comprising:
   a high-dose semiconductor region of the first conductivity type provided in the semiconductor substrate at a portion of the first surface corresponding to the VLD region, the high-dose semiconductor region having a concentration of a first conductivity type impurity higher than that of the semiconductor substrate.

5. The semiconductor device according to claim 4, wherein the concentration of the second conductivity type impurity in the ballast resistance region has a maximum value at a first distance in a depth direction from the first surface, the first distance being longer than a thickness of the high-dose semiconductor region.

6. The semiconductor device according to claim 1, wherein the semiconductor device comprises an insulated gate bipolar transistor (IGBT).

7. The semiconductor device according to claim 1, wherein a thickness of the fourth semiconductor region above the second sub-region is greater than a thickness of the fourth semiconductor region above the first sub-region and less than a thickness of the fourth semiconductor region above the third sub-region.

8. The semiconductor device according to claim 1, wherein the VLD region is electrically connected to the base region.

* * * * *